United States Patent [19]

Ko

[11] Patent Number: 4,574,382
[45] Date of Patent: Mar. 4, 1986

[54] VARIABLE LENGTH CHARACTER CODE SYSTEM

[75] Inventor: Michael A. Ko, Austin, Tex.

[73] Assignee: International Business Machines Corporation, Armonk, N.Y.

[21] Appl. No.: 539,249

[22] Filed: Oct. 5, 1983

[51] Int. Cl.⁴ .............................................. H04B 14/04
[52] U.S. Cl. ...................................... 375/25; 358/261; 340/347 DD
[58] Field of Search .......................... 375/25, 104, 118; 178/2 B, 26 A, 79, 113; 340/347 DD; 358/261, 263; 382/56

[56] References Cited

U.S. PATENT DOCUMENTS

| | | | |
|---|---|---|---|
| 3,156,768 | 11/1964 | Wagner | 358/260 |
| 3,400,392 | 9/1968 | Willcox et al. | 375/114 |
| 3,597,539 | 8/1971 | Clark | 375/114 |
| 3,777,066 | 12/1973 | Nicholas | 375/114 |
| 4,101,934 | 7/1978 | Fukuoka | 358/261 |
| 4,121,259 | 10/1978 | Preuss et al. | 358/261 |
| 4,163,260 | 7/1979 | Hisao et al. | 358/261 |
| 4,168,513 | 9/1979 | Hains et al. | 358/261 |
| 4,228,467 | 10/1980 | de Loye et al. | 358/261 |
| 4,276,544 | 6/1981 | Iinuma | 358/261 |
| 4,360,840 | 11/1982 | Wolfrum et al. | 358/261 |

OTHER PUBLICATIONS

"A Method for the Construction of Minimum Redundancy Codes", D. Huffman, *Proceedings of IRE,* Sep. 1952, vol. 40, pp. 1098-1101.

*Primary Examiner*—Robert L. Griffin
*Assistant Examiner*—Stephen Chin
*Attorney, Agent, or Firm*—J. B. Kraft; Marilyn D. Smith

[57] ABSTRACT

A coding system applicable to communication is provided so that variable length code representations of a set of characters may be transmitted. The system transmits a data stream made up of a series of variable length code representations of the characters in the set. A fixed code representation follows the end of each character representation. This data stream is received by apparatus which includes coding apparatus which reads the fixed code representations in order to determine the ends of each variable length character representation. The coding is set up so that the code is a binary code in which the most commonly used characters in the set are represented by code having the minimum number of digits, and the progressively less commonly used characters are respectively represented by code having progressively increasing numbers of digits. Preferably the fixed code representing the end of each character is 01.

5 Claims, 3 Drawing Figures

VARIABLE LENGTH CHARACTER CODE SYSTEM

DESCRIPTION

1. Technical Field

The present invention relates to digital communication systems and more particularly digital coding in such digital communication systems.

2. Background Art

With the explosion of digital data processing systems throughout the industrialized countries of the world, there has arisen a need for effective means of communicating digital information over greater distances in telecommunication links forming networks which span the industrialized world.

This remarkable expansion of data processing systems has been to a large extent made possible by the generally decreasing cost in data processing apparatus and services. On the other hand, the telecommunications technology has certainly not kept pace with the data processing industry in cost reductions. Consequently, the cost of communication has been assuming an increasing proportion of the overall cost involved in digital processing networks. Thus, we have the need for expedients for lowering communications costs. Since telecommunication costs are directly related to the amount of time necessary for data transmission, it follows that any reduction in the amount of data to be transmitted through data compression approaches should have an effect on reducing such telecommunication cost.

One existing approach towards such data compression have been coding approaches such as the Huffman Coding approach which is based on the recognition that in virtually all text, some symbols and characters are likely to occur much more often than others. This has resulted in coding schemes including Huffman Coding in which common symbols or characters are assigned short codes and rare symbols are assigned longer codes. In this connection reference is made to the article entitled "A Method For the Construction of Minimum Redundancy Codes", D. Huffman, *Proceedings of IRE,* September 1952, Vol. 40, pages 1098–1101. While Huffman Coding did result in data compaction, implementation of Huffman Coding involves rather complex approaches for distinguishing the characters from each other.

U.S. Pat. No. 3,777,066, Method and System for Synchronizing the Transmission of Digital Data While Providing Variable Length Filler Code, D. C. Nicholas, Dec. 4, 1973, covers a communication system wherein the communicated characters are coded by a variable number of bits not unlike a Huffman code. However, there appear to be no indicators to designate the end of a character. Rather, the end of the character is deciphered by the receiving device which has means for determining when a given character pattern coincides with the bit pattern for a particular character. With this approach, the coding must be such that no portion of the coding for each character can encompass the binary coding for another character. Thus, the number of bit positions required to represent the code for a given set of characters is still substantially great.

U.S. Pat. No. 3,156,768, Variable Length Code Method and System, L. H. Wagner, Nov. 10, 1964, covers a variable length code in which the characters in a set are coded by a number of frames, there being 1, 2 or 3 frames per character. Although the frames may vary somewhat in number, the system does not appear to deal with codes having a variable number of bits by which to represent each character. Also, the method appears to require some sort of synchronization between the characters being received.

U.S. Pat. No. 4,101,934, Coding System, K. Fukuoka, July 18, 1978, also describes some typical prior art data compression through the use of variable length character codes.

As will be hereafter seen in greater detail, the present invention provides an effective expedient in the use of variable length character code in the communication of digital data.

DISCLOSURE OF THE INVENTION

The present invention provides a data compression expedient which should substantially reduce telecommunication costs. It is based on the concept of assigning variable length binary code representation to alphanumeric characters so that the most commonly used characters in the set are represented by code having a minimum number of digits and the progressively less commonly used characters are represented by codes having progressively increasing number of digits. The key to the present invention is the inclusion into the coded data stream of fixed digital code representations following the end of each character code representation so that the end of each variable length character may be quickly and efficiently recognized. The data stream of the present invention may be used in communication wherein the means for transmitting the data stream has associated therewith means for encoding into the unique variable length character code, and the receiving means have means for decoding the characters from the character code. Preferably the fixed code representing the end of each character is 01.

BRIEF DESCRIPTION OF THE DRAWINGS

Referring now to the drawings, wherein a preferred embodiment of the invention is illustrated, and wherein like reference numerals are used throughout to designate like parts.

BEST MODE FOR CARRYING OUT THE INVENTION

Figure 1:
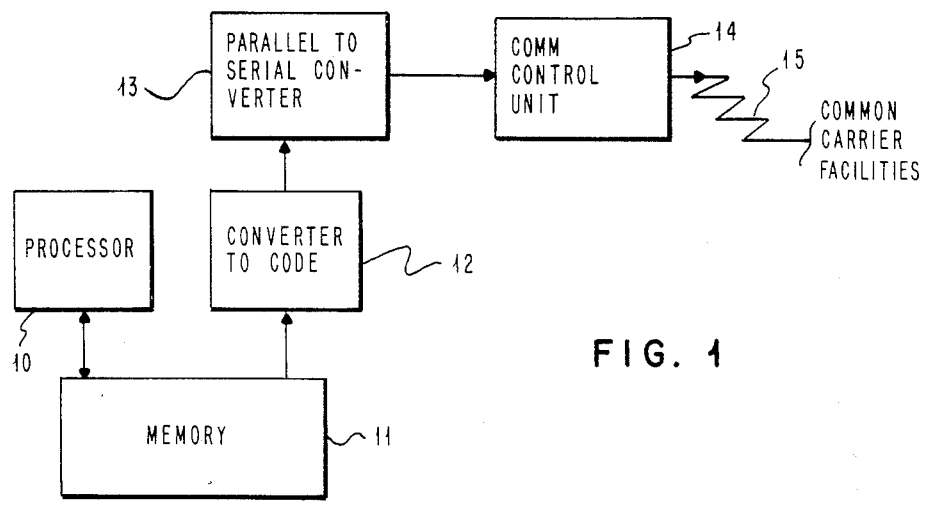
FIG. 1 is a generalized logical block diagram showing typical apparatus which may be used to encode a data stream in accordance with the present invention and to transmit that data stream.
Figure 2:
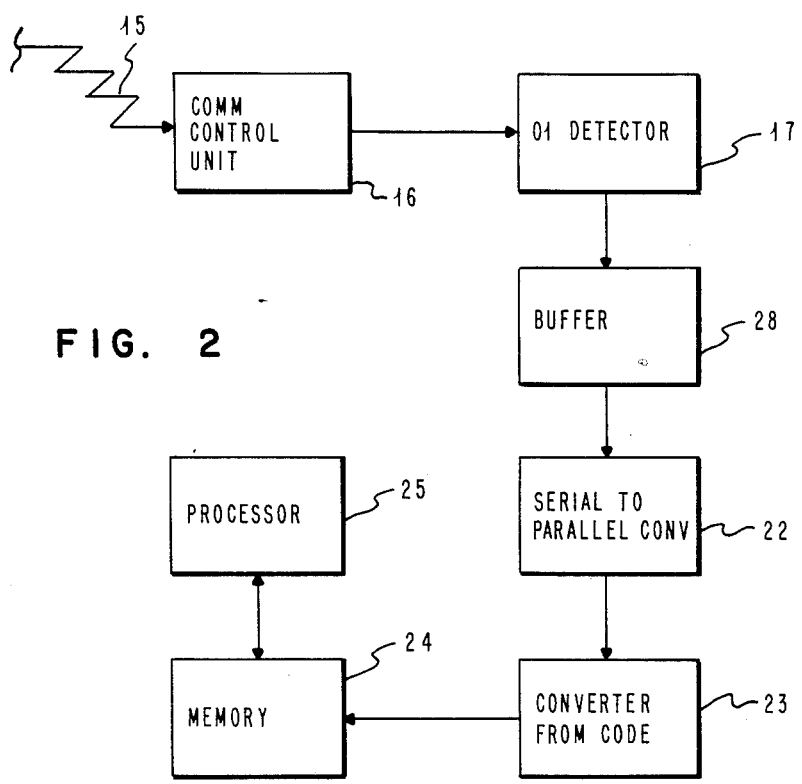
FIG. 2 is a block diagram of generalized logic which may be used to receive and to decode the received data stream.

With reference to FIGS. 1 and 2, the present invention will be described with respect to a communication system of which FIG. 1 shows the apparatus at the transmitting end and FIG. 2 shows the apparatus at the receiving end. The transmitting system of FIG. 1 and the receiving system of FIG. 2 are each respectively data processing systems, and data from the system of FIG. 1 is to be transmitted to this data processing system shown in FIG. 2. First with reference to the transmitting data processing system of FIG. 1, this system consists of a conventional processing unit 10 and supporting memory 11. In the course of this data processing system operation, let us assume that the need arises to transmit data to another system shown in FIG. 2. For convenience in illustration, let us further assume that the data processing system of FIGS. 1 and 2 are part of an electronic document exchange network such as that described in the article entitled "Electronic Information Interchange in an Office Environment", by M. R. DeSousa, *IBM Systems Journal*, Vol. 20, No. 1, 1981, at page 4. The document distribution or interchange architecture which specifies typical data stream content as well as the rules involved in communication of the data stream are described in that article. In any event, the transmission in such a network would be serial in nature.

The processor 10 selects the data which is to be transmitted from data stored in memory 11. The data representative of an alphanumeric message is transferred character by character from memory 11 to converter 12 which converts the character from the code in which it has been stored in memory 11 and used in the operation of the data processing system shown in FIG. 1 to the present compressed code which is to be used in the subsequent communication. For purposes of this example, the system under the control of processor 10 internally uses the EBCDIC code character representation in parallel form. First, these must be converted in converter 12 to the present code. This conversion may be accomplished by any conventional code conversion means such as the encoders described in the above listed U.S. Pat. Nos. 3,777,066 and 4,101,934. The code of the present invention for the characters in the alphabet is shown in the following code table:

CODE TABLE

| Character | Code |
|---|---|
| E | 01 |
| T | 001 |
| O | 101 |
| A | 0001 |
| N | 1001 |
| I | 1101 |
| R | 00001 |
| S | 10001 |
| H | 11001 |
| D | 11101 |
| L | 000001 |
| C | 100001 |
| F | 110001 |
| U | 111001 |
| M | 111101 |
| P | 0000001 |
| Y | 1000001 |
| W | 1100001 |
| G | 1110001 |
| B | 1111001 |
| V | 1111101 |
| K | 00000001 |
| X | 10000001 |
| J | 11000001 |
| Q | 11100001 |
| Z | 11110001 |

The Code Table will be stored in memory 10 and the code converter will look up the character represented by the internally functioning EBCDIC code in this Code Table and convert it to the code of the present invention. It should be noted that each of the characters in the table ends with a fixed code representation, 01. Alternatively, a fixed code representation of 00, 10 or 11 would be used, as long as the codes are modified such that the chosen fixed code does not appear within the code itself other than as the last two bits.

The code representation for each of the characters is variable with the most commonly used characters being represented by a code having a minimum number of digits while the progressively less commonly used characters are respectively represented by codes having progressively increasing numbers of digits. It should be noted that in the above code, it takes approximately an average of 4.41 digits or bits including the 01 designation at the end of each code representation to represent all of the characters in the alphabet while it takes Huffman Code 4.24 digits or bits per character. Thus, at the minimal 0.17 average additional bits per character, the present code is able to achieve a variable length character code in which the ends of the characters are quite easy to determine. The converted code is still in parallel and is then converted in parallel to serial converter 13 so that the data may be serially transmitted. The data then passes through communication control unit 14 which controls the transmission of data over data link 15 which may involve common carrier facility such as telephone lines. The communication over linkage 15 under the control of unit 14 involves conventional transmission of data under control protocols such as Synchronous Data Link Control (SDLC). The data is serially transmitted over link 15 to communication control unit 16 in the receiving data processing system shown in FIG. 2.

Figure 3:
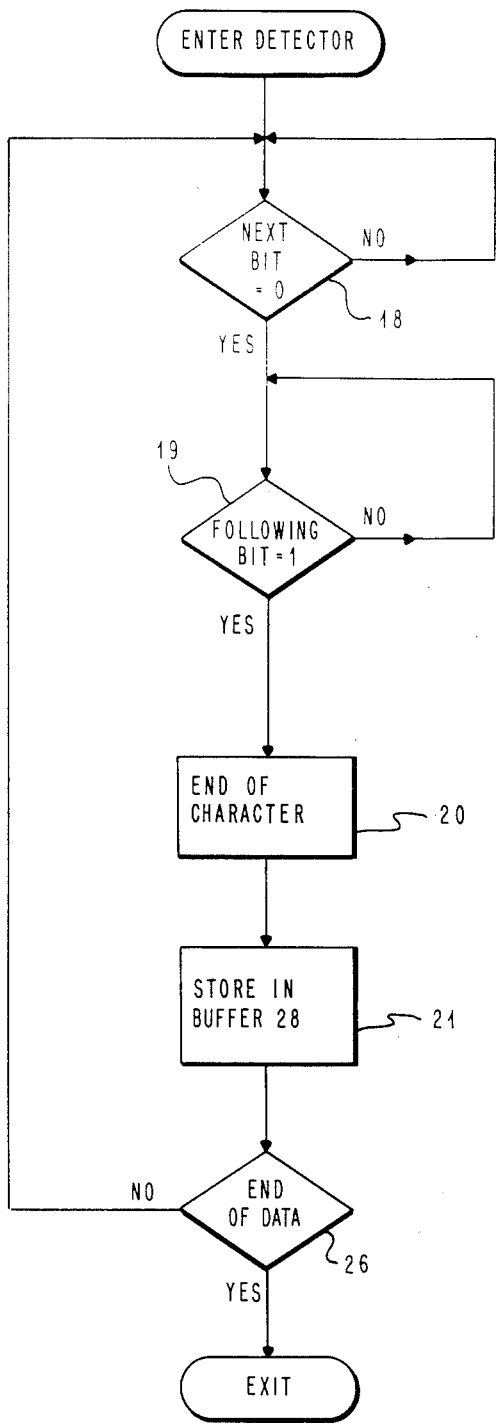
FIG. 3 is a flow chart showing the general steps involved in determining the ends of variable length character representations in the data stream in accordance with the present invention.

The received serial data stream is then passed through and examined bit by bit by "01" detector 17 of which the operative steps may be considered now with reference to the flow chart of FIG. 3.

Upon entering the detector operations, the next bit in the data stream is examined, decision step 18, to determine if it is a zero. If it is not a zero, then, the procedure is returned to decision step 18 and the next character is examined to determine if it is a zero. If it is determined in decision step 18 that a next character is a zero, then, the operation proceeds to decision step 19. If in decision step 19, it is determined that the bit following the zero bit is not a one, then the procedure is returned to decision step 19. On the other hand, if a determination is made in decision step 19 that the following bit is a one, then we have the 01 designation indicating the end of a character, step 20, and that character, step 21, is stored in buffer 28 of FIG. 2. A determination is then made, step 26, if the procedure is at the end of data. If it is, there is an exit. If not, then the procedure is returned to decision step 18.

Continuing now with the description of FIG. 2, the serial representation of a character coded in accordance with the present invention and stored in buffer 28, is now passed through the serial to parallel converter where it is converted to the parallel data form required for the internal operations of the receiving data processing system shown in FIG. 2. At this stage coded representation of the character is converted from code of the present invention back to the code such as EBCDIC which is used in the receiving data processor. This is done in converter 23 which may be any conventional decoding device as described in above mentioned U.S. Pat. Nos. 3,777,066 or 4,101,934. Here again, the above listed table is used to convert from the present code for each character back to the appropriate EBCDIC code for the same character. Finally, the EBCDIC coded representations of the characters are stored in memory 24 from which they are available for operations of the receiving system of FIG. 2 under the control of processor 25.

While the invention has been particularly shown and described with reference to a preferred embodiment it will be understood by those skilled in the art that various other changes in form and detail may be made without departing from the spirit and scope of the invention.

I claim:

1. A digital communication system for transmitting variable length code representations of a set of characters comprising means for transmitting a data stream comprising a sequence of variable length digital code representations of said characters and a fixed digital code representation having a predetermined bit sequence following the end of each character representation, said predetermined bit sequence occurring only within said fixed digital code representation, wherein said fixed digital code representation forms an integral part of each of said variable length digital code representations, and means for receiving said data stream including decoding means for reading fixed code representations in order to determine the end of each variable length character representation.

2. The communication system of claim 1 wherein said code comprises binary digits with the most commonly used characters in said set being represented by code having a minimum number of digits and the progressively less commonly used characters respectively represented by code having progressively increasing numbers of digits.

3. The communication system of claim 2 wherein said fixed code representation following the end of each character representation is 01.

4. A coding method comprising forming a data stream of variable length binary code representations of a set of characters with the most commonly used characters in said set being represented by code having a minimum number of digits and the progressively less commonly used characters respectively represented by code having progressively increasing numbers of digits, and including a fixed binary code representation having a predetermined bit sequence in said data stream following the end of each character representation for indicating the end of each character representation, said predetermined bit sequence occurring only within said fixed digital code representation, wherein said fixed binary code representation forms an integral part of each of said variable length binary code representations.

5. The method of claim 4 wherein said fixed code representation is 01.

* * * * *